(12) United States Patent
Gawase et al.

(10) Patent No.: US 9,558,961 B2
(45) Date of Patent: Jan. 31, 2017

(54) MANUFACTURING METHOD OF SEMICONDUCTOR DEVICE

(71) Applicant: KABUSHIKI KAISHA TOSHIBA, Tokyo (JP)

(72) Inventors: Akifumi Gawase, Mie (JP); Yukiteru Matsui, Aichi (JP); Kenji Iwade, Mie (JP); Takahiko Kawasaki, Aichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/009,103

(22) Filed: Jan. 28, 2016

(65) Prior Publication Data

US 2016/0358787 A1    Dec. 8, 2016

(30) Foreign Application Priority Data

Jun. 2, 2015 (JP) ................. 2015-112109

(51) Int. Cl.
| | | |
|---|---|---|
| *H01L 21/302* | (2006.01) | |
| *H01L 21/311* | (2006.01) | |
| *H01L 21/265* | (2006.01) | |
| *H01L 21/02* | (2006.01) | |
| *H01L 21/324* | (2006.01) | |

(52) U.S. Cl.
CPC ...... *H01L 21/31111* (2013.01); *H01L 21/0217* (2013.01); *H01L 21/02167* (2013.01); *H01L 21/26506* (2013.01); *H01L 21/324* (2013.01)

(58) Field of Classification Search
None
See application file for complete search history.

(56) References Cited

U.S. PATENT DOCUMENTS

| | | |
|---|---|---|
| 7,651,625 B2 | 1/2010 | Yamauchi et al. |
| 8,703,004 B2 | 4/2014 | Matsui et al. |
| 8,734,661 B2 | 5/2014 | Yamauchi et al. |
| 2002/0072253 A1* | 6/2002 | Edwards, Jr. ........... C30B 25/18 438/795 |
| 2008/0073222 A1 | 3/2008 | Yamauchi et al. |
| 2008/0233709 A1* | 9/2008 | Conti ................ H01L 21/31111 438/424 |

(Continued)

FOREIGN PATENT DOCUMENTS

| | | |
|---|---|---|
| JP | 2004-319609 | 11/2004 |
| JP | 2006-114632 | 4/2006 |
| JP | 4506399 | 5/2010 |

*Primary Examiner* — Alexander Ghyka
(74) *Attorney, Agent, or Firm* — Finnegan, Henderson, Farabow, Garrett & Dunner LLP

(57) ABSTRACT

In accordance with an embodiment, a manufacturing method of a semiconductor device includes: respectively forming a first layer and a second layer at the top of a protruding portion and at the bottom of a depressed portion of a treatment target having protrusions/depressions in such a manner that sidewalls of the protruding portion is exposed, supplying a treatment liquid to the treatment target having the first layer and the second layer, bringing a catalyst into contact with or closer to the first layer and thereby increasing the dissolution rate of the first layer in dissolving into the treatment liquid and dissolving the first layer into the treatment liquid, and sequentially dissolving the protruding portion and the second layer into the treatment liquid after the dissolution of the first layer.

12 Claims, 3 Drawing Sheets

(56) References Cited

U.S. PATENT DOCUMENTS

| | | | |
|---|---|---|---|
| 2011/0039480 A1* | 2/2011 | Choi | B24B 21/004 |
| | | | 451/64 |
| 2011/0309425 A1* | 12/2011 | Purayath | H01L 21/764 |
| | | | 257/316 |
| 2012/0001193 A1 | 1/2012 | Sano et al. | |
| 2013/0119013 A1 | 5/2013 | Matsui et al. | |
| 2014/0220778 A1 | 8/2014 | Gawase et al. | |
| 2015/0357189 A1* | 12/2015 | Davis | H01L 21/28512 |
| | | | 257/29 |
| 2016/0035598 A1* | 2/2016 | Kodera | H01L 21/31055 |
| | | | 156/345.15 |
| 2016/0064243 A1* | 3/2016 | Gawase | H01L 21/31055 |
| | | | 438/692 |
| 2016/0155626 A1* | 6/2016 | Chang | C08F 220/18 |
| | | | 438/283 |
| 2016/0155632 A1* | 6/2016 | Su | G03F 7/40 |
| | | | 438/703 |

\* cited by examiner

MANUFACTURING METHOD OF SEMICONDUCTOR DEVICE

CROSS REFERENCE TO RELATED APPLICATIONS

This application is based upon and claims the benefit of priority from the prior Japanese Patent Application No, 2015-112109, filed on Jun. 2, 2015, the entire contents of which are incorporated herein by reference.

FIELD

Embodiments described herein relate generally to a manufacturing method of a semiconductor device.

BACKGROUND

Recently, in the manufacture of a semiconductor device, a chemical mechanical polishing (hereinafter briefly referred to as "CMP") method has been widely used to flatten an insulating film, a metallic film, or a polycrystalline silicon film which is formed to fill a trench formed in a substrate. In the CMP method a chemical action resulting from a chemical is combined with a mechanical action resulting from abrasive grains to flatten a treatment target surface, specifically by supplying, onto an abrasive cloth, a polishing agent (slurry) including the abrasive grains and the chemical and bringing a treatment target into contact with the abrasive cloth.

However, the CMP method has a problem in that mechanical damage by the abrasive grains could not be avoided and a polishing damage might be caused to a treatment target surface.

DETAILED DESCRIPTION

In accordance with an embodiment, a manufacturing method of a semiconductor device includes: respectively forming a first layer and a second layer at the top of a protruding portion and at the bottom of a depressed portion of a treatment target having protrusions/depressions in such a manner that sidewalls of the protruding portion is exposed, supplying a treatment liquid to the treatment target having the first layer and the second layer, bringing a catalyst into contact with or closer to the first layer and thereby increasing the dissolution rate of the first layer in dissolving into the treatment liquid and dissolving the first layer into the treatment liquid, and sequentially dissolving the protruding portion and the second layer into the treatment liquid after the dissolution of the first layer.

Embodiments will now be explained with reference to the accompanying drawings. Like components are provided with like reference signs throughout the drawings and repeated descriptions thereof are appropriately omitted, it is to be noted that the accompanying drawings illustrate the invention and assist in the understanding of the illustration and that the shapes, dimensions, and ratios and so on in each of the drawings may be different in some parts from those in an actual apparatus.

In the specification of the present application "providing on" not only includes providing a layer in direct contact with a layer but also includes providing a layer on a layer with another layer interposed therebetween.

Figure 1:
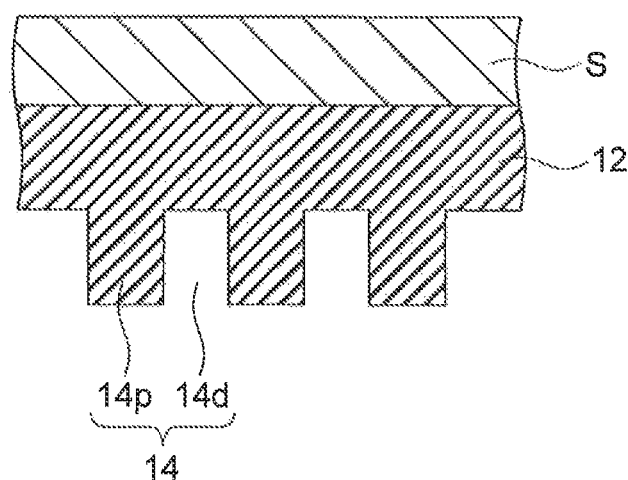
FIG. 1, FIG. 2, FIG. 3, FIG. 4, and FIG. 5 are schematic sectional views illustrating a manufacturing method of a semiconductor device according to one embodiment.

FIG. 1 is a schematic sectional view showing an example of a treatment target in a manufacturing method of a semiconductor device according to one embodiment. A treatment target 12 shown in FIG. 1 is a film provided on a surface of a substrate 5, and has protrusions/depressions 14 in the surface (lower surface in the drawing) opposite to the substrate S. The protrusions/depressions 14 include a protruding portion 14$p$ and a depressed portion 14$d$.

In the process described below, one of the surfaces of the treatment target 12 which has the protrusion/depressions 14 and on the opposite side to the substrate S side is a treatment target surface.

The substrate S is, for example, a semiconductor substrate or a glass substrate, or may be an insulating film formed on a surface of a semiconductor substrate.

In the present embodiment, a silicon oxide film is described as the treatment target 12 by way of example. However, the treatment target 12 is not exclusively an insulating film such as the silicon oxide film, and may be a metallic film such as a tungsten film.

Figure 2:
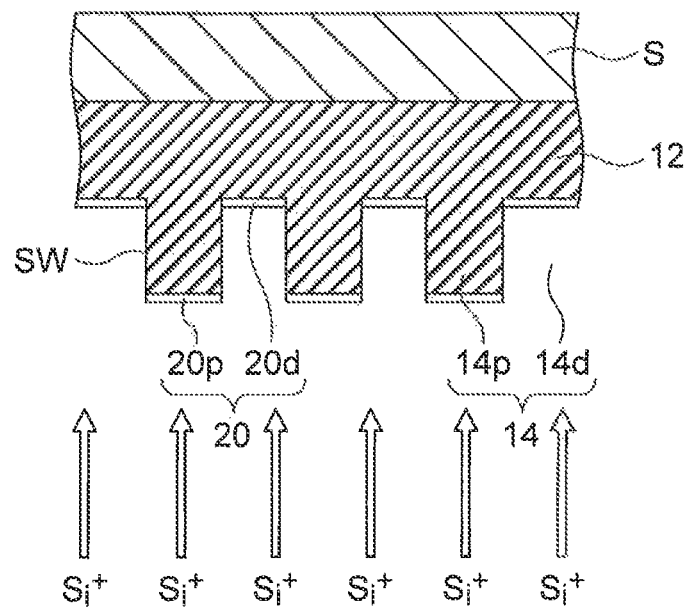

First, as shown in FIG. 2, a sacrificial layer 20 is formed on the treatment target surface of the treatment target 12. The sacrificial layer 20 is formed in such a manner that a sidewall SW of the protruding portion 14$p$ of the protrusion/depressions 14 is exposed. As a result, the sacrificial layer 20 is composed of a sacrificial layer 20$p$ formed at the top of the protruding portion 14$p$ and a sacrificial layer 20$d$ formed at the top of the depressed portion 14$d$. In the present embodiment, the sacrificial layers 20$p$ and 20$d$ correspond to, for example, a first layer and a second layer.

In the present embodiment, the sacrificial layer 20 is formed by use of silicon. More specifically, as indicated by arrows in FIG. 2, silicon ions ($Si^+$) are implanted to form a silicon-rich layer.

The sacrificial layer 20 is not exclusively the silicon-rich layer. As will be described layer, the sacrificial layer 20 is also applicable to, for example, a silicon carbide layer or a silicon nitride layer as long as such a layer is a sacrificial layer having a dissolution rate lower than the dissolution rate of the treatment target 12 in association with a treatment liquid (see the sign 30 in FIG. 3). Any kind of layer can be selected without direct dependency on the material of the treatment target 12. The sacrificial layer 20 may be formed by depositing a new layer using a chemical vapor deposition (CVD) method, a coating method, or a sputtering method, or may be formed by implanting carbon ions or nitrogen ions and thereby modifying the treatment target surface (see FIG. 2).

Figure 3:
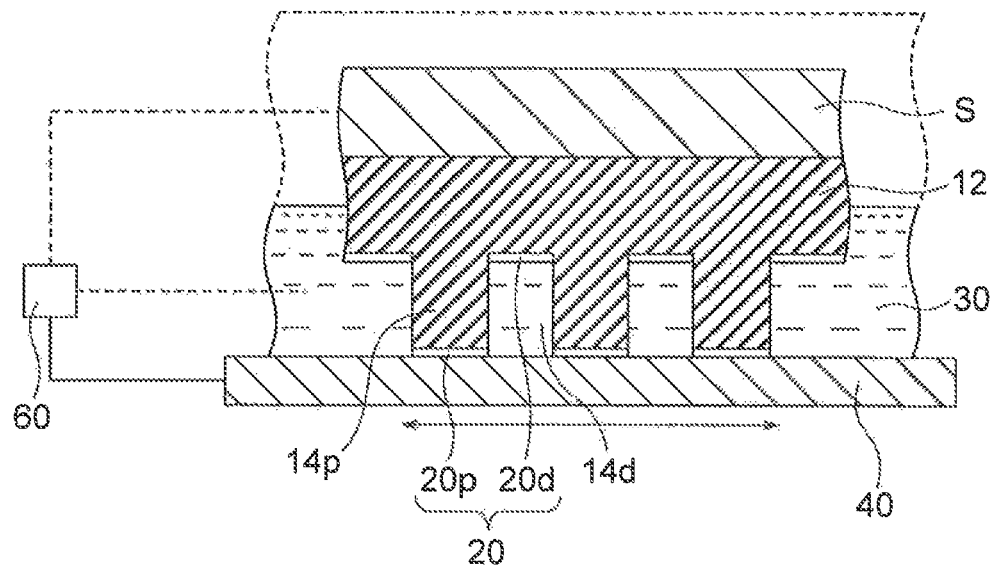

As shown in FIG. 3, after a solid catalyst flat plate 40 is disposed so as to face the treatment target surface of the treatment target 12, the treatment liquid 30 is supplied to the space between the treatment target 12 and the solid catalyst flat plate 40 by an unshown nozzle, and then, the treatment target 12 and the solid catalyst flat plate 40 are relatively moved to reduce the distance therebetween in such a manner that the sacrificial layer 20$p$ at the top of the protruding portion 14$p$ comes into contact with or comes closer to the solid catalyst flat plate 40.

The treatment liquid 30 includes at least a solution of the treatment target 12. More specifically, the treatment liquid 30 is preferably a hydrofluoric acid (HF) which is a solution of a silicon oxide film or a strong alkaline aqueous solution, or a mixture of the above and an oxidizing reagent such as hydrogen peroxide water ($H_2O_2$). In the present embodiment, the mixture of the hydrofluoric acid (HF) and hydrogen peroxide water ($H_2O_2$) is used.

Here, "to bring closer" means bringing the sacrificial layer 20p and the surface of the solid catalyst flat plate 40 closer to each other to such a degree that the dissolution rate of the sacrificial layer 20p to dissolve into the treatment liquid 30 is improved by the catalysis of the solid catalyst flat plate 40.

The solid catalyst flat plate 40 is made by molding a solid catalyst into a plate shape. The sacrificial layer 20 which has come into contact with or come closer to the solid catalyst flat plate 40 (e.g. the sacrificial layer 20p on the protruding portion 14p) reacts with the treatment liquid 30 due to the catalysis of the solid catalyst flat plate 40 and dissolves. In contrast, the sacrificial layer 20 which is located relatively apart from the solid catalyst flat plate 40 (e.g. the sacrificial layer 20d on the depressed portion 14d) hardly dissolves into the treatment liquid 30 because of no catalysis.

Figure 4:
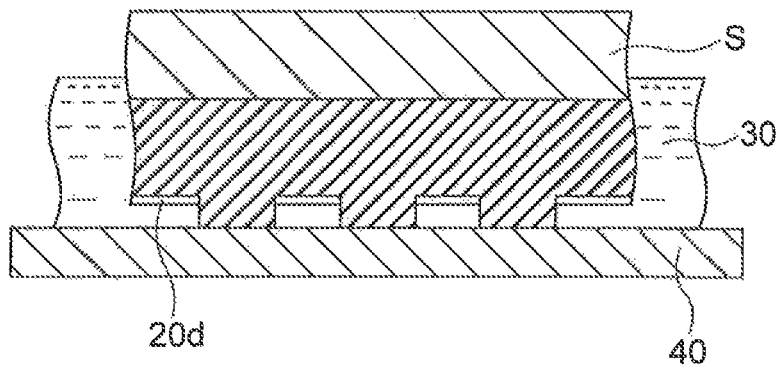

Therefore, the sacrificial layer 20p on the protruding portion 14p dissolves and disappears, and the treatment target 12 of the protruding portion 14p is exposed. The exposed treatment target 12 dissolves into the treatment liquid 30 as shown in FIG. 4.

However, the treatment target 12 at the bottom of the depressed portion 14d is protected by the sacrificial layer 20d and therefore does not dissolve into the treatment liquid 30.

At the point where the protruding portion 14p of the treatment target 12 has substantially disappeared, the sacrificial film 20d formed at the bottom of the depressed portion 14d also comes into contact with or comes closer to the solid catalyst flat plate 40 and thereby dissolves into the treatment liquid 30. At this stage in the process, when the dissolution rate at which the sacrificial film 20d that comes into contact with or comes closer to the solid catalyst flat plate 40 dissolves into the treatment liquid 30 due to the catalysis is much higher than that of the treatment target 12 exposed between the sacrificial films 20d, the sacrificial film 20d dissolves in preference to the treatment target 12. In this case, less treatment target 12 dissolves during the dissolution of the sacrificial film 20d, and therefore, the flatness of the treatment target surface of the treatment target 12 is enhanced (see FIG. 5). In the present embodiment, the dissolution rate of the sacrificial film 20d to dissolve into the treatment liquid 30 is adjusted by the adjustment of the amount of Si to be implanted.

As described above, in the present embodiment, a silicon-rich layer is used as the sacrificial layer 20, and the mixture of the hydrofluoric acid (HF) and hydrogen peroxide water ($H_2O_2$) is used as the treatment liquid 30. Therefore, the sacrificial layer 20 dissolves into the treatment liquid 30 by the following reaction:

$$Si + 6F^- \rightarrow SiF_6^{2-} + 4e \quad \text{(Formula 1)}$$

$$H_2O_2 + 2e^- \rightarrow 2OH^- \quad \text{(Formula 2).}$$

The solid catalyst flat plate 40 has only to act to assist the oxidation of the sacrificial layer 20, and is preferably a metallic catalyst such as ruthenium, rhodium, palladium, silver, osmium, iridium, platinum, or gold.

Figure 5:
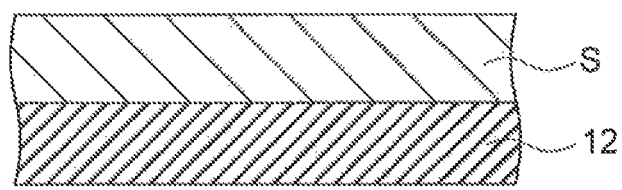

After the flattening of the treatment target 12 has been finished, the substrate S and the treatment target 12 are brought away from the solid catalyst flat plate 40 and dehydrated, as shown in FIG. 5. Before the dehydration, the treatment target surface of the treatment target 12 may be cleaned with a chemical or cleaned with a brush.

The treatment liquid 30 is, but not exclusively, supplied to the space between the treatment target 12 and the solid catalyst flat plate 40 in the case shown in FIG. 3. For example, as partly indicated by broken lines FIG. 3, an unshown treatment bath may be filled with the treatment liquid 30, and the substrate S, the treatment target 12, and the whole solid catalyst flat plate 40 may be immersed in the treatment liquid 30. In this case, a plurality of narrow holes may be formed in the solid catalyst flat plate 40 in a direction perpendicular to the surface facing the treatment target 12, and the treatment liquid 30 may be supplied through these holes. When immersed in the treatment liquid 30, the treatment target 12 is taken out of the treatment liquid 30 after the end of flattening.

The dissolution reaction of the sacrificial layer 20 with the treatment liquid 30 continuously advances at an adequate velocity if, for example, the materials of the sacrificial layer 20, the solid catalyst flat plate 40, and the treatment liquid 30 are properly selected. Thus, the pressure to press the substrate S and the solid catalyst flat plate 40 against each other is not particularly limited.

However, depending on the kind of treatment liquid 30 or solid catalyst flat plate 40, an adequate reaction velocity may not be obtained if the sacrificial layer 20 and the solid catalyst flat plate 40 are simply brought into contact with or brought closer to the solid catalyst flat plate 40. In this case, it is possible to efficiently advance the reaction by raising the temperature in the part where the sacrificial layer 20 and the solid catalyst flat plate 40 come into contact with or come closer to each other.

For example, as shown in FIG. 3, it is possible to raise the temperature in the part where the sacrificial layer 20 and the solid catalyst flat plate 40 come into contact with or come closer to each other by connecting a heat source 60 to the solid catalyst flat plate 40. The heat source 60 is not exclusively connected to the solid catalyst flat plate 40, and it is also possible to raise the temperature by connecting the heat source 60 to at least one of the substrate S and the treatment liquid 30 instead of or together with the solid catalyst flat plate 40.

When the treatment target 12 and the solid catalyst flat plate 40 are brought into contact, it is also possible to raise the temperature in the part where the sacrificial layer 20 and the solid catalyst flat plate 40 come into contact with or come closer to each other by moving at least one of the treatment target 12 and the solid catalyst flat plate 40 in a plane parallel to the surface of the solid catalyst flat plate 40 facing the treatment target 12 and thereby generating frictional heat, for example, as indicated by an arrow in FIG. 3.

Thus, according to the manufacturing method of the semiconductor device in the present embodiment, the sacrificial layer 20 which has come into contact with or come closer to the solid catalyst flat plate 40 is chemically dissolved into the treatment liquid 30, so that the treatment target surface is flattened not by mechanical polishing but by a chemical reaction alone. Therefore, polishing damage to the treatment target surface can be inhibited.

Furthermore, according to the manufacturing method of the semiconductor device in the present embodiment, the sacrificial layer 20 and the solid catalyst flat plate 40 have only to come into contact with or come closer to each other in the treatment liquid 30 in such a manner that the sacrificial layer 20 may dissolve. Therefore, it is possible to select any treatment target without directly depending on the kind of treatment target 12 and the material of the treatment target 12. Consequently, many kinds of treatment targets can be flattened.

Figure 6:
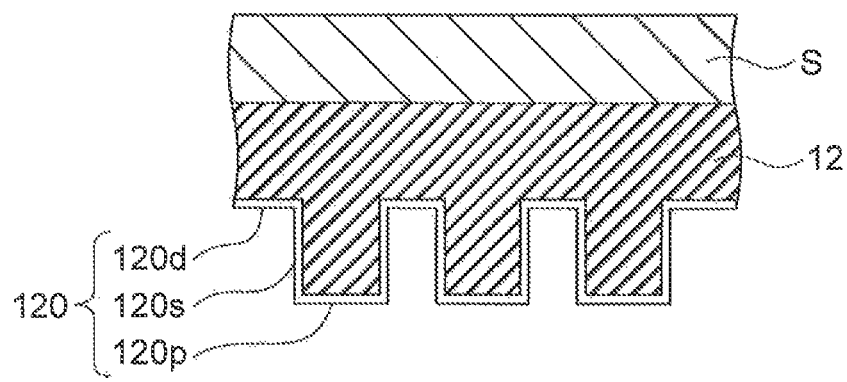
FIG. 6 and FIG. 7 are schematic sectional views illustrating a manufacturing method of a semiconductor device according to a comparative example.

Here, there is known a method whereby the sacrificial layer 20 is formed on the entire treatment target surface of the treatment target 12 and then exposed to the treatment liquid 30, and brought into contact with or brought closer to the solid catalyst flat plate 40 to dissolve the treatment target surface of the treatment target 12. This is a case in which a sacrificial layer 120 composed of a sacrificial layer 120p, a sacrificial layer 120s, and a sacrificial layer 120d that are respectively provided at the top of a protruding portion, on the sidewall of the protruding portion, and at the bottom of a depressed portion is formed, for example, as shown in FIG. 6.

Figure 7:
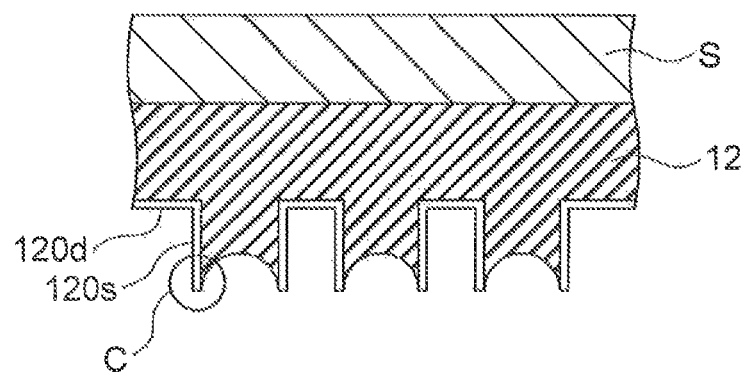

However, when the sacrificial layer 120 formed on the entire treatment target surface is used, the dissolution rate of the treatment target 12 exposed at the top of the protruding portion may be higher than the dissolution rate of the sacrificial layer 120s on the sidewall of the protruding portion to dissolve into the treatment liquid 30 after the sacrificial layer 120p at the top of the protruding portion has disappeared as a result of dissolution into the treatment liquid 30. As indicated by an area C encircled in FIG. 7, in many cases, a projecting part called a "horn" may be formed around the top of the protruding portion, and a depression in a mortar shape may be generated at the top of the protruding portion of the treatment target 12. In this case, it takes time to remove the protruding portion, which may cause productivity deterioration and finally cause difficulty in the flattening of treatment target surface.

In contrast, according to the manufacturing method of the semiconductor device in at least one embodiment described above, the sacrificial layer 20p and the sacrificial layer 20d are respectively formed at the top of the protruding portion 14p and at the bottom of the depressed portion 14d in such a manner that the treatment target 12 is exposed on the sidewall SW of the protruding portion 14p, and the treatment liquid 30 is supplied to the treatment target 12 while the treatment target 12 is brought into contact with or brought closer to the solid catalyst flat plate 40, and then the sacrificial layer 20p, the protruding portion 14p, and the sacrificial layer 20d are dissolved into the treatment liquid 30 in this order. Consequently, it is possible to flatten the treatment target surface of the treatment target 12 with high productivity while inhibiting the damage to the treatment target surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device comprising:
respectively forming a first layer and a second layer at the top of a protruding portion and at the bottom of a depressed portion of a treatment target comprising protrusions/depressions in such a manner that sidewalls of the protruding portion is exposed;
supplying a treatment liquid to the treatment target comprising the first layer and the second layer;
bringing a catalyst into contact with or closer to the first layer and thereby increasing the dissolution rate of the first layer in dissolving into the treatment liquid and dissolving the first layer into the treatment liquid; and
sequentially dissolving the protruding portion and the second layer into the treatment liquid after the dissolution of the first layer.

2. The method of claim 1,
wherein the second layer dissolves into the treatment liquid by bringing the catalyst into contact with or closer to the second layer and thereby increasing the dissolution rate of the second layer to dissolve into the treatment liquid.

3. The method of claim 1,
wherein the dissolution rate at which the second layer dissolves into the treatment liquid is higher than the dissolution rate of the protruding portion to dissolve into the treatment liquid after the dissolution of the first layer.

4. The method of claim 1,
wherein the protrusions/depressions comprising the first layer and the second layer are silicon oxide films, and the silicon content concentration of the first layer or the second layer is higher than the silicon content concentration of the protruding and depressed portions other than the first layer and the second layer.

5. The method of claim 1,
wherein the first layer and the second layer are simultaneously formed by implanting silicon into the protrusions/depressions.

6. The method of claim 1,
wherein the first layer and the second layer are made of a material comprising a dissolution rate lower than the dissolution rate of the treatment target to dissolve into the treatment liquid.

7. The method of claim 6,
wherein the material is a silicon carbide or a silicon nitride.

8. The method of claim 7,
wherein the first and second layers are simultaneously formed by implanting carbon ions or nitrogen ions into the protrusions/depressions.

9. The method of claim 1,
wherein the first and second layers are formed by a CVD method, a coating method, or a sputtering method.

10. The method of claim 1,
wherein the catalyst comprises at least one substance selected from the group consisting of ruthenium, rhodium, palladium, silver, osmium, iridium, platinum, and gold.

11. The method of claim 1, further comprising
increasing the temperature of the part in which the catalyst and the first layer come in contact with or come closer to each other.

12. The method of claim 11,
wherein increasing the temperature comprises moving at least one of the catalyst and the treatment target in a plane parallel to the surface of the catalyst facing the treatment target and thereby generating frictional heat.

* * * * *